US007148685B2

(12) United States Patent
Block et al.

(10) Patent No.: US 7,148,685 B2
(45) Date of Patent: Dec. 12, 2006

(54) MAGNETIC RESONANCE IMAGING WITH FAT SUPPRESSION

(75) Inventors: Walter F. Block, Madison, WI (US); Aiming Lu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 28 days.

(21) Appl. No.: 10/940,738

(22) Filed: Sep. 14, 2004

(65) Prior Publication Data

US 2005/0253579 A1 Nov. 17, 2005

Related U.S. Application Data

(60) Provisional application No. 60/570,152, filed on May 12, 2004.

(51) Int. Cl.
*G01V 3/00* (2006.01)
(52) U.S. Cl. .................................................. 324/307
(58) Field of Classification Search ................ 324/307, 324/309, 306
See application file for complete search history.

(56) References Cited

U.S. PATENT DOCUMENTS

| 4,818,941 A | 4/1989 | McKinnon |
| 5,243,284 A | 9/1993 | Noll |
| 6,307,368 B1 | 10/2001 | Vasanawala et al. |
| 6,608,479 B1 * | 8/2003 | Dixon et al. ................ 324/307 |
| 6,750,651 B1 * | 6/2004 | Overall ........................ 324/309 |
| 6,794,867 B1 * | 9/2004 | Block et al. ................. 324/307 |
| 6,922,054 B1 * | 7/2005 | Hargreaves et al. ........ 324/307 |

FOREIGN PATENT DOCUMENTS

WO    WO 03/098267    * 11/2003

OTHER PUBLICATIONS

Chris A. Flask et al, Radial Alternating TE Sequence for Faster Fat Suppression, Magnetic Resonance in Medicine 50:1095-1099 (2003).
Brian Dale et al, A Rapid Look-Up Table Method For Reconstructing MR Images From Arbitrary k-Space Trajectories, IEEE Transactions on Medical Imaging, vol. 20, No. 3, Mar. 2001.
A. Lu et al, Vastly Undersampled Isotropic Projection Reconstruction Imaging With Multi-Half-Echo (VIPR ME), Proc. Intl. Soc. Mag. Reson. Med. 11 (2003), p. 210.
A. Lu et al, Fat Suppression In Single Acquisition Steady-State Free Precession Using Multiple Echo Radial Trajectories, Proc. Intl. Soc. Mag. Reson. Med. 11 (2004), p. 264.
John J. Jackson, et al, Selection Of A Convolution Function For Fourier Inversion Using Gridding; IEEE Trans. on Med. Imaging., vol. 10, No. 3, Sep. 1991; pp. 473-478.
Klaus Scheffler et al, Magnetization Preparation During The Steady State: Fat-Saturated 3D TrueFISP, Mag. Reson. in Med. 45:1075-1080 (2001).

(Continued)

*Primary Examiner*—Diego Gutierrez
*Assistant Examiner*—Dixomara Vargas
(74) *Attorney, Agent, or Firm*—Quarles & Brady LLP

(57) ABSTRACT

A three-dimensional projection reconstruction pulse sequence acquires two half echoes in a steady state free precession (SSFP) scan. A method for combining the two echoes to suppress either fat or water in the reconstructed image is described includes shifting the phase of one echo and combining them in a regridding process used to transform the radial data to a Cartesian grid prior to image reconstruction.

12 Claims, 10 Drawing Sheets

OTHER PUBLICATIONS

Shreyas S. Vasanawala, et al, Fluctuating Equilibrium MRI, Mag. Reson. in Med. 42:876-883 (1999).

Shreyas S. Vasanawala, et al, Linear Combination Steady-State Free Precision MRI, Mag. Reson, in Med. 43:82-90 (2000).

Brian A. Hargreaves et al, Fat-Suppressed Steady-State Free Precession Imaging Using Phase Detection, Mag. Reson. in Med. 50:210-213 (2003).

* cited by examiner

MAGNETIC RESONANCE IMAGING WITH FAT SUPPRESSION

CROSS-REFERENCE TO RELATED APPLICATIONS

This application is based on U.S. Provisional Patent Application Ser. No. 60/570,152 filed on May 12, 2004 and entitled "MAGNETIC RESONANCE IMAGING WITH FAT SUPPRESSION".

STATEMENT REGARDING FEDERALLY SPONSORED RESEARCH

This invention was made with government support under Grant No. EB002075 awarded by the National Institute of Health. The United States Government has certain rights in this invention.

BACKGROUND OF THE INVENTION

The field of the invention is nuclear magnetic resonance imaging (MRI) methods and systems. More particularly, the invention relates to steady state free precession (SSFP) methods for acquiring MRI data and suppressing fat signal in reconstructed images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most MRI scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques.

With the recent introduction of high performance gradient systems on commercially available MRI systems these SSFP imaging pulse sequences have received more attention. Not only do they significantly shorten scan time, but they also have relatively high SNR while providing $T_2$-like contrast based on the $T_2/T_1$ ratio of tissues.

Two major problems are associated with the SSFP acquisition method. First, the images produced have undesirably bright lipid signals due to the high $T_2/T_1$ ratio of fat spins. The bright signal complicates clinical interpretation and obscures nearby tissues of greater clinical significance. Second, when using SSFP pulse sequences signal dropout and banding artifacts can appear in regions of Bo field inhomogeneity. To reduce banding artifacts and maximize signal-to-noise (SNR) efficiency, an extremely short repetition time ("TR") is usually desired.

Two methods to suppress fat in SSFP images are described in U.S. Pat. No. 6,307,368. In the Fluctuating Equilibrium MR (FEMR) method, RF phase cycling creates transverse magnetization that fluctuates between water and fat signal on alternating pulse sequences. The second method, Linear Combination SSFP (LCSSFP), acquires two image datasets with SSFP pulse sequences using different RF phase cycles and then linearly combines the datasets during the image reconstruction. With this approach, image data sets can be combined differently to create both fat and water images without a loss in SNR efficiency.

To operate properly the FEMR and LCSSFP fat suppression methods require the use of a SSFP pulse sequence having a very short repetition period(TR). Both FEMR and LCSSFP work best when a 180° phase shift occurs between fat and water spins during each TR interval. The ideal repetition time for perfect fat water separation at 1.5T, therefore, is approximately 2.2 ms. However, obtaining such a short TR is difficult without sacrificing readout resolution, which limits the applicability of the method.

Recently, a dual echo implementation of a 3D projection reconstruction pulse sequence was described by A. Lu, et al., Proc. 11th ISMRM, 320 (2003). In this pulse sequence a first echo is acquired during the playout of the dephasing lobe of the readout gradients to sample one radial line in k-space, and a second echo is acquired during the playout of the rephasing lobe of the readout gradients to sample an adjacent radial line in k-space. After one complete acquisition of k-space the process is repeated to acquire a second k-space data set with different RF phasing such that the two k-space data sets c combined to suppress either fat or water.

SUMMARY OF THE INVENTION

The present invention is a method for acquiring NMR data with a projection reconstruction pulse sequence from which both a fat suppressed and water suppressed images may be reconstructed. By exciting magnetization at a frequency between fat and water resonances and acquiring NMR data during both dephasing and rephasing lobes of the readout gradient waveform, two echo signals are acquired which can be combined during subsequent image reconstruction to suppress either fat or water. This enables fat suppressed images to be acquired in shorter scan times or at higher resolution or at a higher SNR.

A general object of the invention is to acquire an SSFP MR image with fat suppression and without increased scan time or reduced resolution or image SNR. By acquiring two echo signals during the projection reconstruction pulse sequence, two separate radial k-space trajectories are sampled during each TR period. The timing is such that corresponding k-space samples acquired in a central region of k-space can be combined to suppress fat signal without a loss of resolution or image SNR.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE PREFERRED EMBODIMENT

Figure 1:
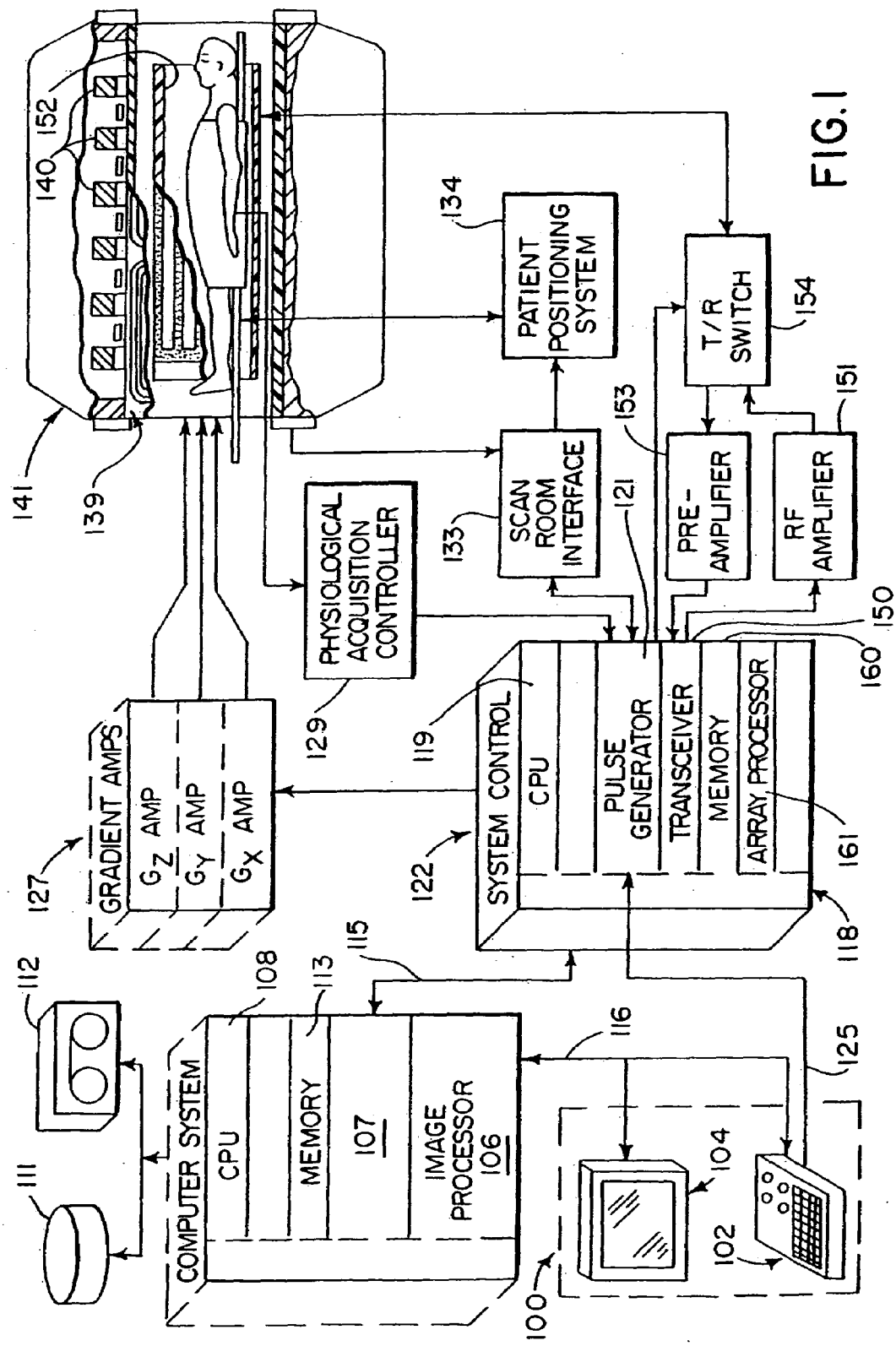
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
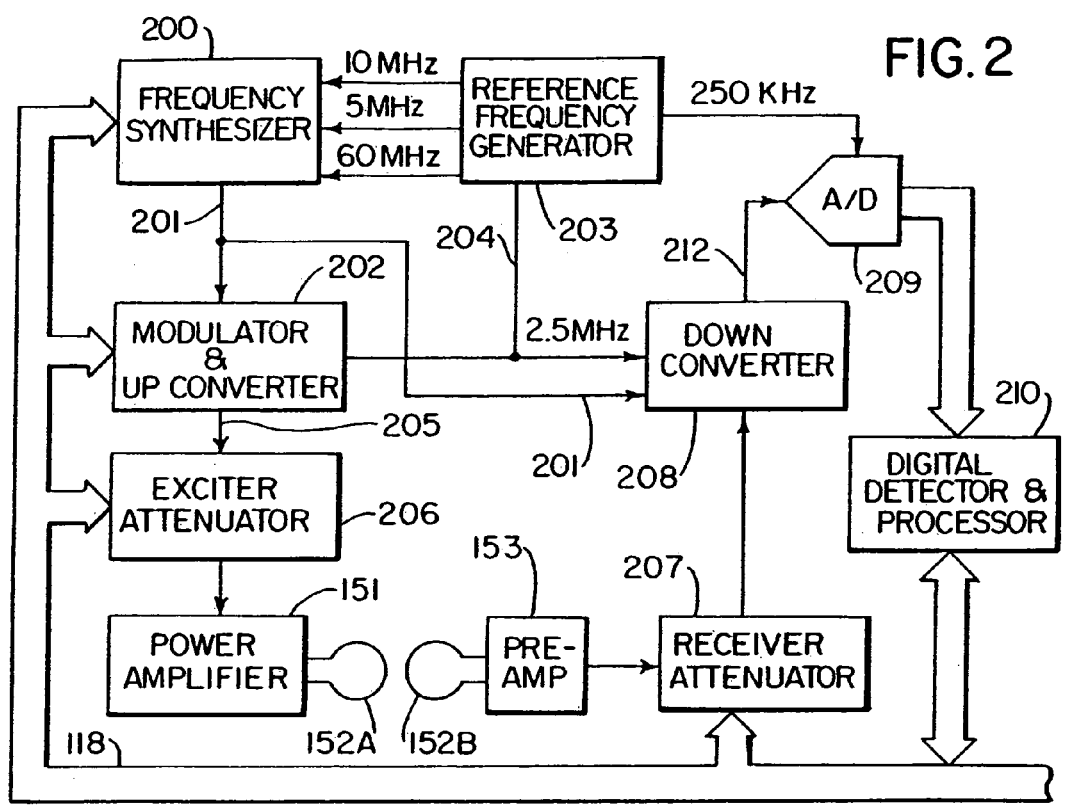
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

To properly suppress either lipid or water signals in a reconstructed SSFP image, the pulse repetition period (TR) must be very short. The LCSSFP method described in U.S. Pat. No. 6,307,368, for example, acquires two k-space image data sets using different rf pulse phase schedules during each of the two image acquisitions. When the two image data sets are combined in one manner, lipid signals are suppressed, and when they are combined in another manner, the water signals are suppressed. This prior method works best when the phase difference of the water and fat spins is 180°, and in a SSFP pulse sequence this translates to an optimal TR of 2.2 ms when implemented in 1.5 Tesla polarizing field.

Figure 3:
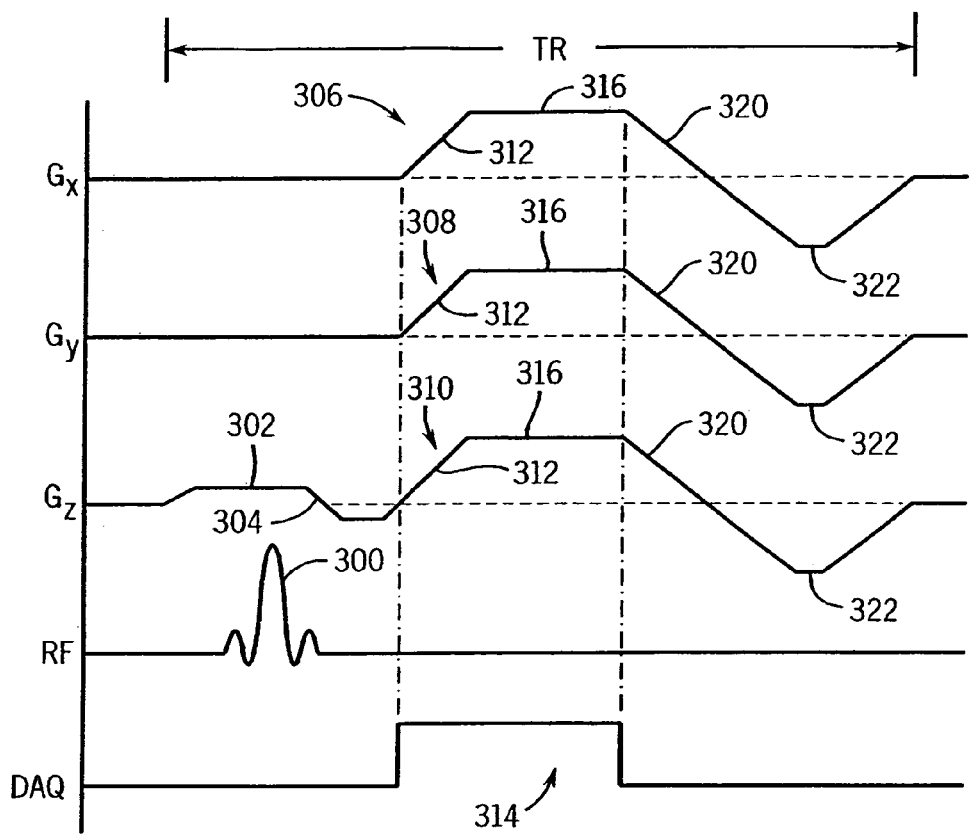
FIG. 3 is a graphic representation of a prior art pulse sequence used to acquire SSFP NMR data with the MRI system of FIG. 1.
Figure 4:
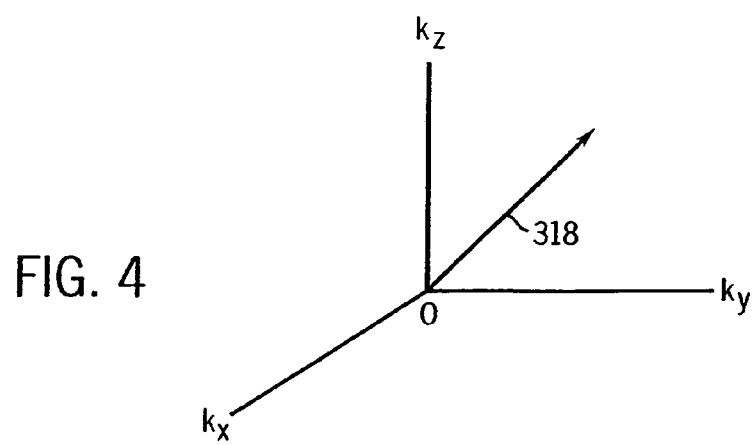
FIG. 4 is a graphic representation of the radial trajectory of k-space samples acquired with the pulse sequence of FIG. 3.

Because no separate and time consuming phase encoding gradient pulses are required, a projection reconstruction pulse sequence is employed to achieve these very short repetition periods (TR). Referring to FIG. 3, a typical 3D projection reconstruction pulse sequence includes an RF pulse 300 which is produced in the presence of a weak slab select $G_z$ gradient pulse 302 to excite spins throughout the 3D volume of interest. The excited spins are rephased by a short $G_z$ rephasing pulse 304 and then three readout gradient waveforms 306, 308 and 310 are produced along respective gradient axes $G_x$, $G_y$ and $G_z$. These readout gradient waveforms have ramp-up portions 312 during which the gradient fields rise to values required to establish the radial readout direction of the three separate fields for this particular SSFP sequence. During the scan, of course, this pulse sequence is repeated many times and the radial readout direction is stepped to different k-space directions to sample throughout a spherical volume of k-space. NMR data is acquired during the short interval indicated at 314 during which the readout waveforms 306, 308 and 310 ramp-up at 312 and maintain a flattop interval 316. As shown in FIG. 4, during this short readout interval 314 NMR signals are acquired to sample k-space along a single radial trajectory 318 that extends from the center of k-space to the periphery of the spherical volume of interest.

Following the data acquisition, the readout gradients 306, 208 and 310 are ramped down in amplitude at 320 and then ramped up again with the opposite polarity to produce rephasing lobes 322. The negative rephasing lobes 322 have the same area as the positive lobes such that the transverse spin magnetization is rephased before the start of the subsequent pulse sequence. Such rephasing is required in all SSFP pulse sequences because there is significant transverse magnetization carried over from one pulse sequence to the next.

It can be seen in FIG. 3 that the sampling efficiency of this typical near-zero-TE, 3D projection reconstruction pulse sequence is low. Data is acquired over a relatively small portion of the TR time.

Figure 5:
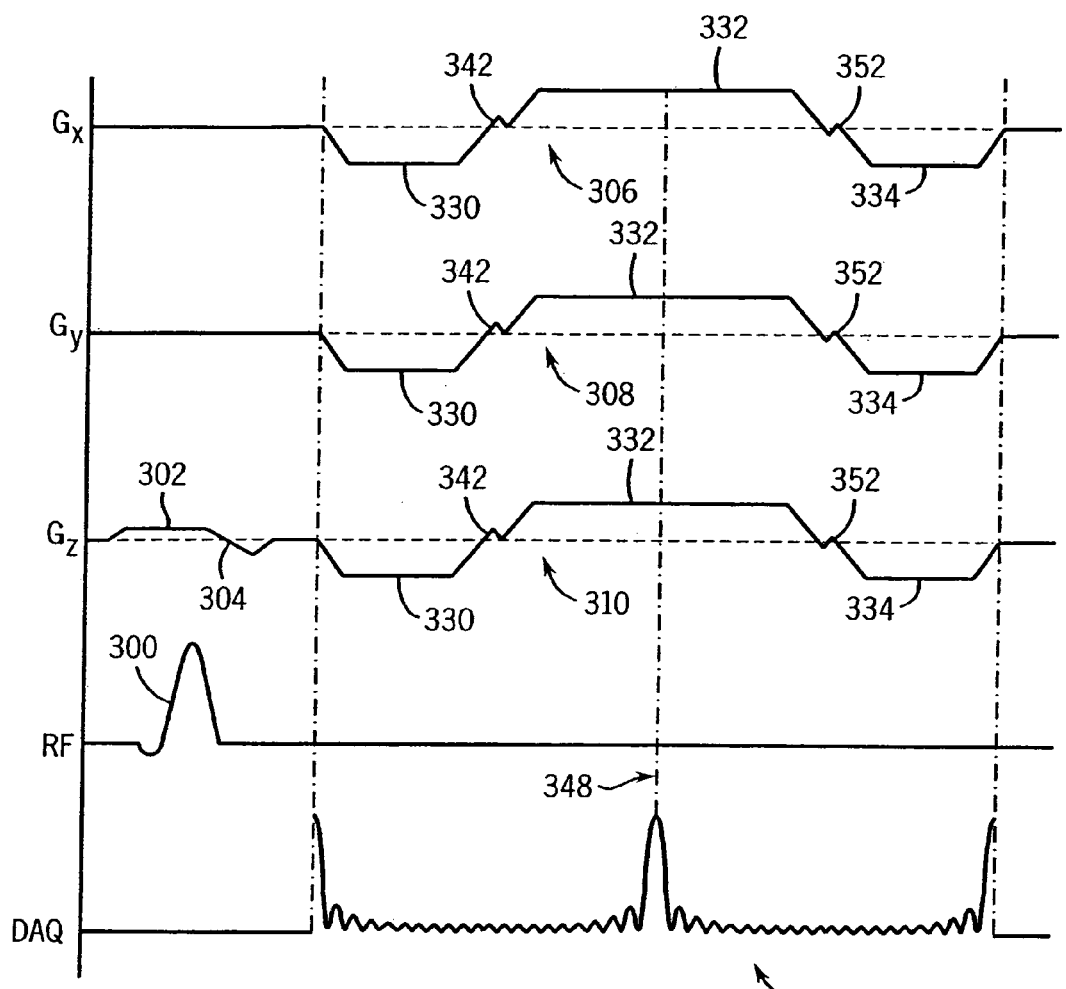
FIG. 5 is a graphic representation of a first preferred pulse sequence used to acquire SSFP NMR data according to the present invention.

Referring particularly to FIG. 5, the data gathering efficiency of a 3D projection reconstruction pulse sequence can be increased by acquiring NMR data throughout the playout of the readout gradient waveforms. In the first embodiment of FIG. 5, the readout gradient waveforms 306, 308 and 310 are comprised of an initial dephasing lobe 330, followed by a readout lobe 332 and then a rephasing lobe 334. Unlike prior pulse sequences, the frequency of the RF pulse 300 is set midway between the fat and water resonant frequencies (63.8 MHz at 1.5T) and NMR data 336 is acquired during the entire playout of these readout gradient waveforms 306, 308 and 310 for two separate k-space data sets.

Figure 6:
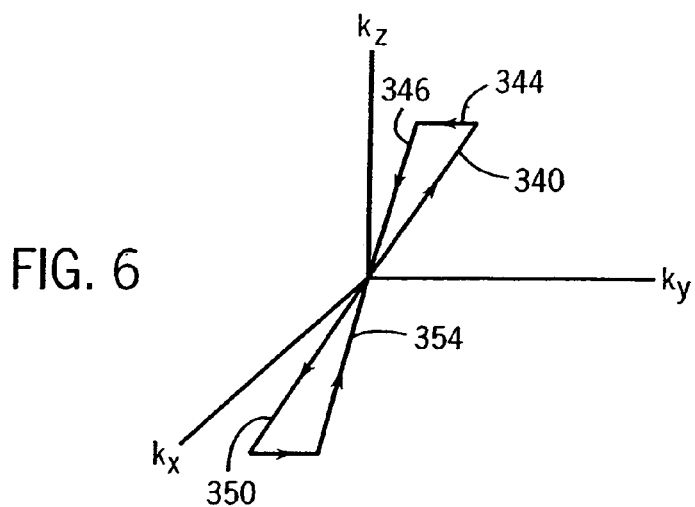
FIG. 6 is a graphic representation of the radial trajectories of k-space samples acquired with the pulse sequence of FIG. 5.

In this first embodiment four radial sampling trajectories are acquired during each pulse sequence. Referring to FIGS. 5 and 6, during the application of dephasing lobes 330 NMR data is acquired and k-space is sampled along a first radial trajectory 340. This sampling is radially outward from the center of k-space and it is performed during the ramps and plateau of the dephasing lobe 330. A small rotation gradient blip 342 is then applied to move the k-space sampling to another radial trajectory starting point as indicated by arrow 344. During the first half of the readout gradient lobe 332 NMR data is sampled along a second radial trajectory 346 back to the center of k-space. At the center of the readout gradient lobe indicated by dotted line 348, the level of each readout gradient $G_x$, $G_y$ and $G_z$ is changed slightly to redirect sampling to another radial direction. As a result, during the playout of the remaining half of the readout gradient lobe 332, k-space data is acquired along a third radial sampling trajectory 350 which is directed away from the center of k-space. NMR data is thus acquired during the playout of the entire readout lobe 332—including its ramps.

Referring still to FIGS. 5 and 6, prior to playing out the rephasing readout gradient lobes 334 another small rotation gradient blip 352 is applied to move the k-space sampling to another radial trajectory. As a result, when NMR signal acquisition is performed during the subsequent rephasing lobe 334, a fourth k-space sampling trajectory 354 is traversed back to the center of k-space. At the completion of the pulse sequence, therefore, a total of four different radial trajectories in k-space capable of creating isotropic 256× 256×256 pixel images have been sampled during a TR period from 3.7 ms to 4.4 ms.

Figure 7:
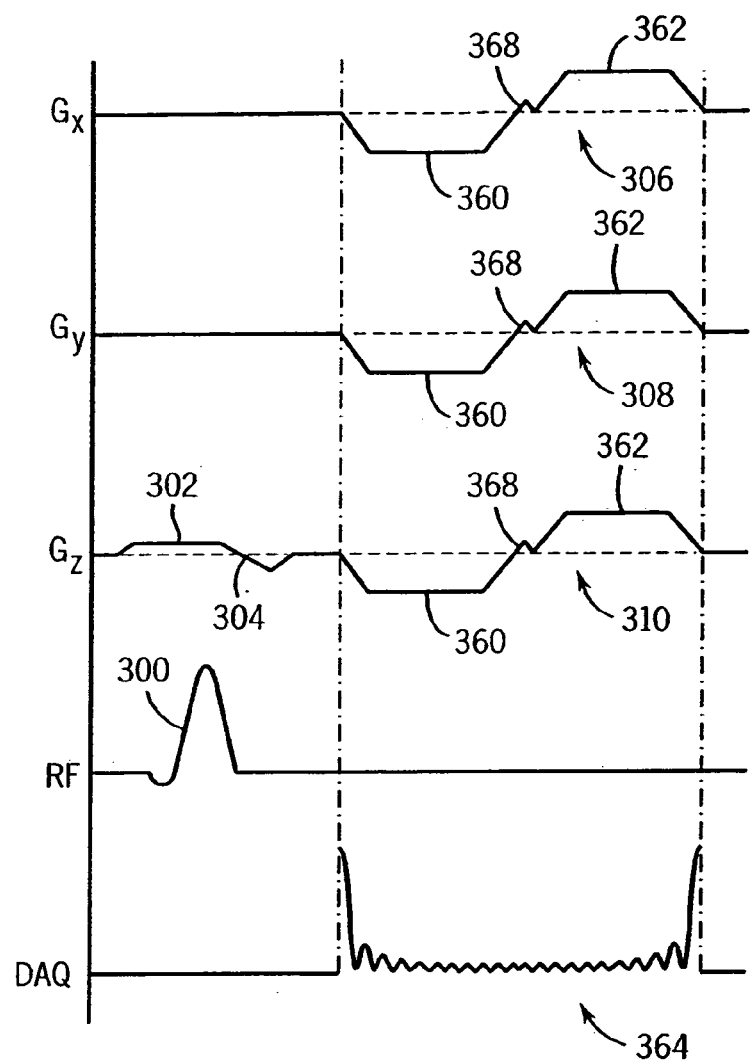
FIG. 7 is a graphic representation of a second preferred pulse sequence used to acquire SSFP NMR data according to the present invention.

Another embodiment of the 3D projection reconstruction pulse sequence is shown in FIG. 7. In this embodiment only two radial projections are acquired, but the pulse sequence can be performed in a shorter repetition period (TR) than the first embodiment described above. As with the pulse sequences described above, transverse magnetization is produced by the application of an rf excitation pulse 300 at a frequency midway between fat and water resonances and in the presence of a weak, slab-select $G_z$ gradient pulse 302. This magnetization is rephased by a small negative $G_z$ gradient lobe 304 and then the three readout gradient waveforms 306, 308 and 310 are played out.

Figure 8:
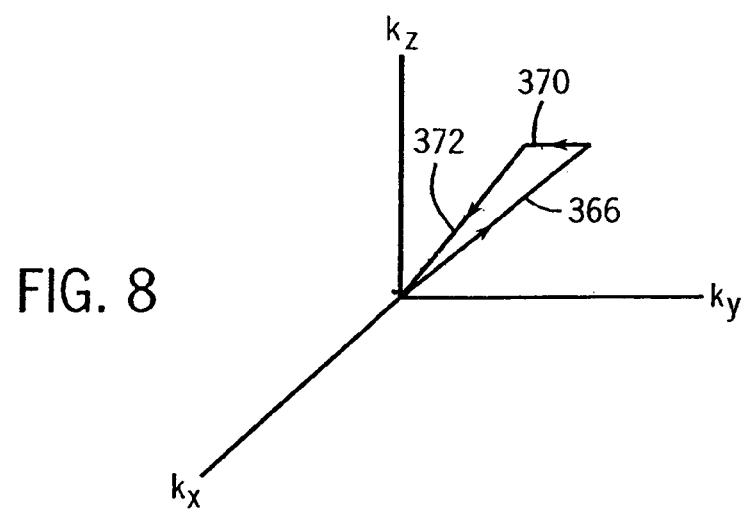
FIG. 8 is a graphic representation of the radial trajectories of k-space samples acquired with the pulse sequence of FIG. 7.

Referring still to FIG. 7, the readout gradient waveforms 306, 308 and 310 are each comprised of a dephasing lobe 360 followed by a rephasing lobe 362. An NMR signal 364 is acquired during nearly this entire period. More specifically, during this playout of the dephasing lobe 360, including its ramps, a first readout k-space trajectory indicated by arrow 366 in FIG. 8 is sampled and stored in one k-space data set. A small rotation gradient blip 368 is then applied along each gradient axis $G_x$, $G_y$ and $G_z$ to move the k-space sampling to another radial trajectory starting point as indicated by arrow 370. During the subsequent rephasing lobe 362, including its ramps, a second radial trajectory 372 is sampled back to the center of k-space and stored in a second k-space data set.

Figure 12:
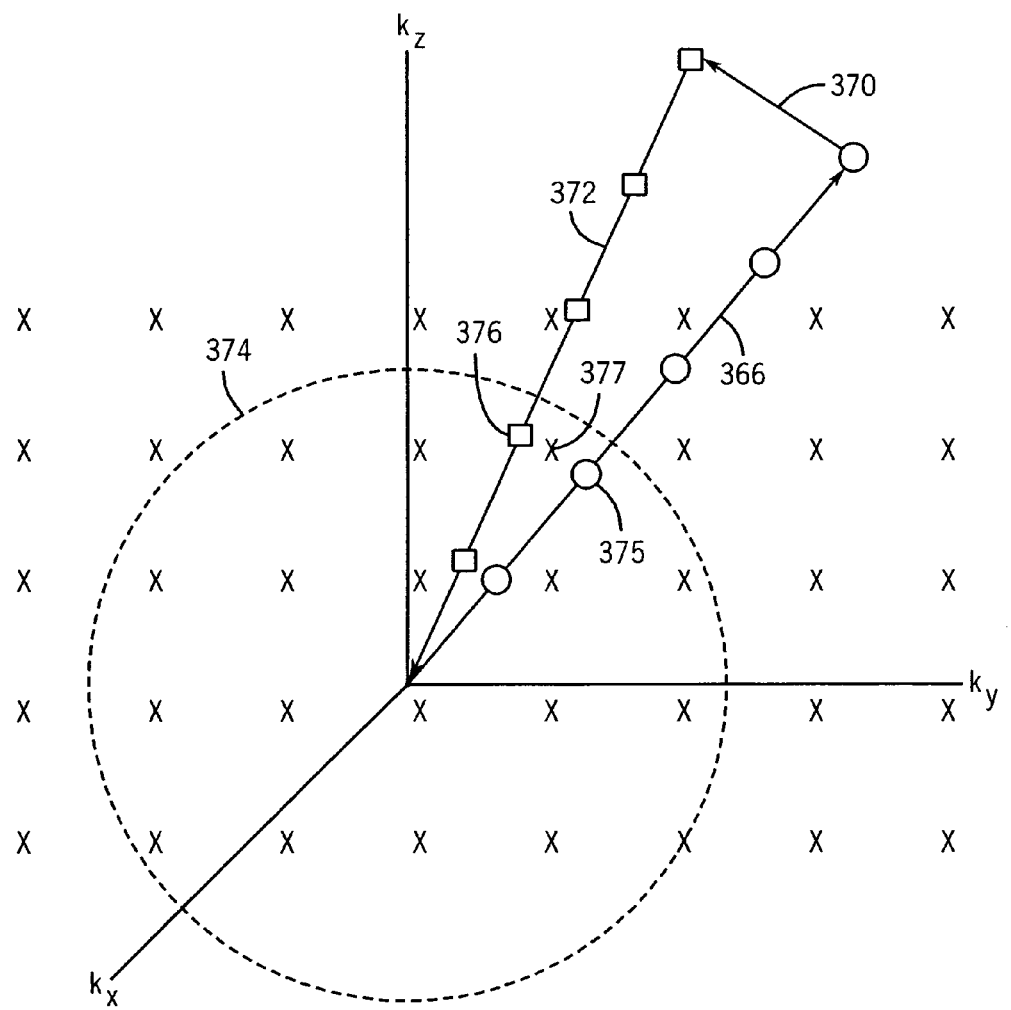
FIG. 12 is a pictorial representation of k-space depicting the sampling points and the points calculated in the method of FIG. 9.
Figure 13A:
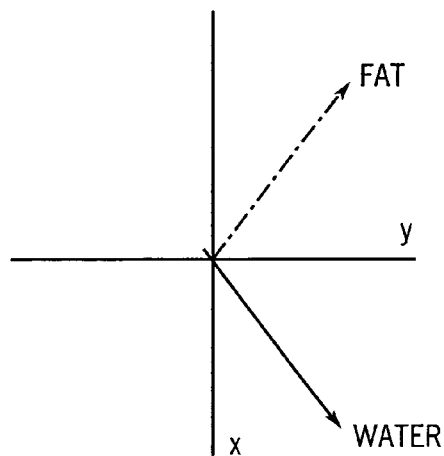
FIGS. 13A–D are vector diagrams showing the phase of signals produced when practicing the present invention.
Figure 13B:
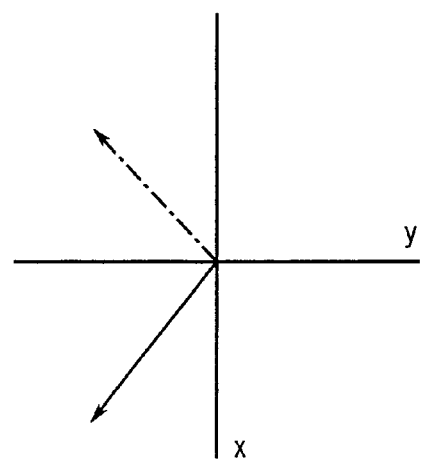
Figure 13C:
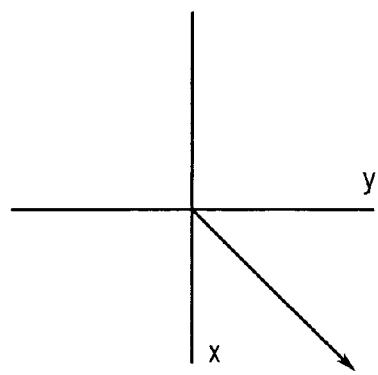
Figure 13D:
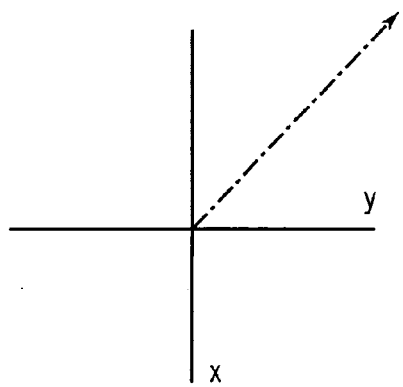

A discovery of the present invention is that two echo signals acquired using a projection reconstruction pulse sequence can be combined to suppress either the fat or water signal even though they are sampling slightly different radial trajectories in k-space. This is shown in FIG. 12, where the k-space samples acquired with a first echo signal to produce the first readout k-space trajectory 366 are indicated by circles and the k-space samples acquired with the second echo signal to produce the second readout k-space trajectory 372 are indicated by squares. By setting the pulse sequence parameters such that there is a 90° phase shift in these two echo signals due to precession in the polarizing magnetic field, they can be combined in either of two ways to suppress water or fat signal. FIG. 13A shows the relative phases of the water and fat spin signals in the first echo at TE1=0.3 ms and FIG. 13B shows their relative phases in the second echo at TE2=1.9 ms. By shifting the phase of the second echo k-space samples by +90° and adding them to the corresponding radial k-space samples in the first echo signal, the fat signals cancel and the water signals add as shown in FIG. 13C. On the other hand, if the phase of the second echo k-space samples are shifted by −90° and added to corresponding k-space samples in the first echo, the water signals cancel and the fat signals add as shown in FIG. 13D. The ideal case is illustrated in FIG. 13 where the time between echo signals is 2.2 ms at 1.5T and the water and fat signals rotate 180 degrees in phase relative to each other. In the currently preferred embodiment the time between echo signals is 1.6 ms and the combination of the signals is not ideal. As will be described in detail below, the echo signals are added during the regridding step.

Figure 9:
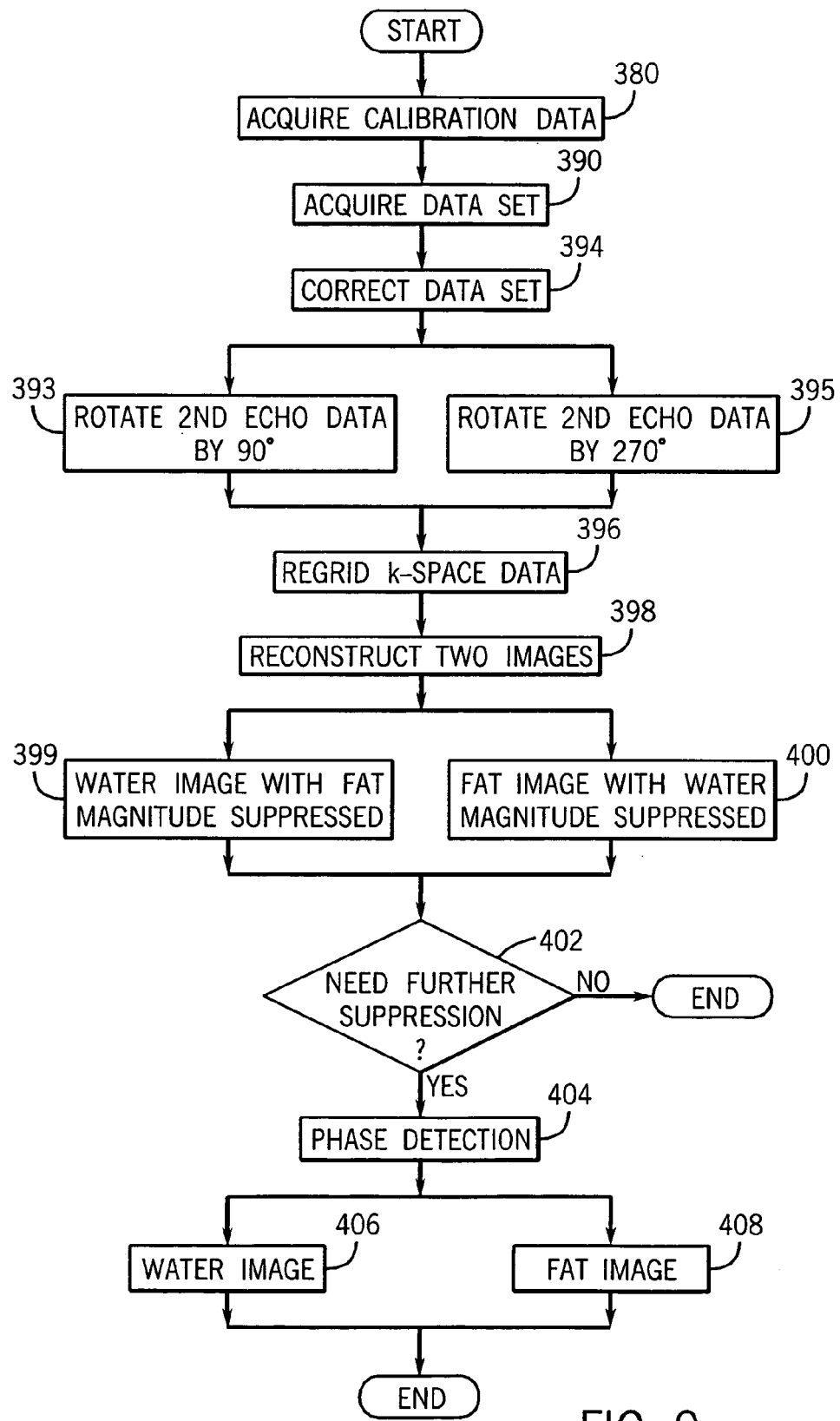
FIG. 9 is a flow chart of the preferred method for practicing the present invention.

The preferred method of practicing the present invention is depicted in FIG. 9. The first step in this method is to acquire calibration data for the selected readout gradient waveform as indicated by process block 380. This calibration data is needed to correct for system instabilities such as eddy currents which create errors in the actual k-space location that is being sampled while the readout gradient is being produced as described by Duyn J H, Yang Y, Frank J A, Veen J W. "Simple Correction Method For K-space Trajectory Deviations In MRI", *J. Magn. Reson.* 1998; 132:150–153.

Figure 10:
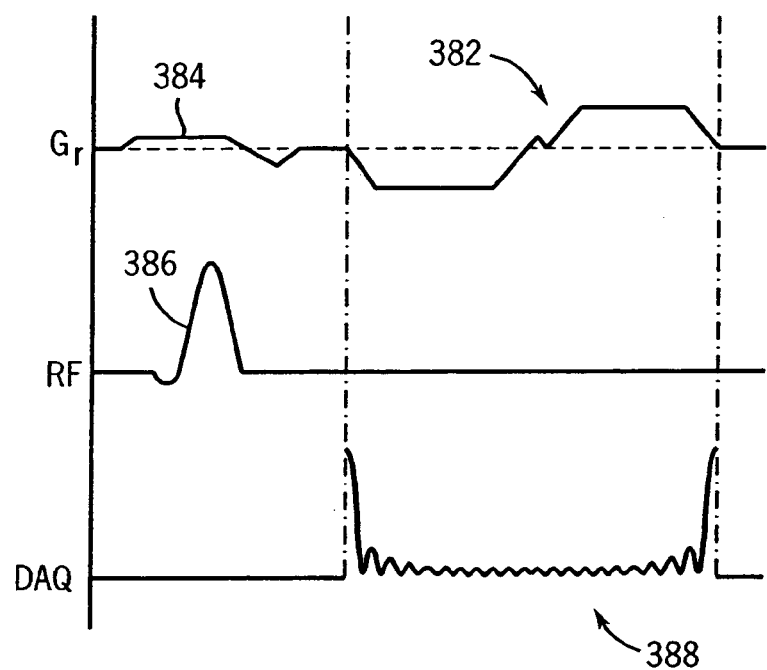
FIG. 10 is a graphic representation of a calibration pulse sequence used to practice the method of FIG. 9.

The calibration data is acquired using a pulse sequence such as that shown in FIG. 10. The readout gradient waveform to be calibrated is indicated at 382 and it is preceded by a thin slice select gradient waveform 384 directed along the same gradient axis. An RF excitation pulse 386 is produced during the application of slice select gradient 384 and the NMR signal is sampled during a window 388 as the gradient waveform 382 is played out. In this example, the readout gradient waveform being calibrated is that used in the pulse sequence of FIG. 7, and the NMR signal is sampled during the period 388 in exactly the same way it is sampled during the performance of the pulse sequence. A thin slice is excited (e.g., 1.5 mm) and this slice is located a distance (D) away from the system isocenter which is large relative to slice thickness (e.g., 30 mm).

The calibration pulse sequence is performed once for each gradient axis $G_x$, $G_y$ and $G_z$. In addition, after each acquisition the calibration pulse sequence is repeated, but with the test gradient 382 set to zero to acquire a reference NMR signal. In other words, calibration data and reference data are acquired for each orthogonal gradient axis. The phase φ(t) of the acquired calibration data and reference data for each gradient axis (x, y and z) is then calculated from the sampled quadrature components Q and I (φ=tan$^{-1}$Q/I). The reference phase data is then subtracted from the calibration phase data to produce three sets of corrected calibration phase data:

$$\Delta\phi_x(t) = D_x k_x(t)$$

$$\Delta\phi_y(t) = D_y k_y(t)$$

$$\Delta\phi_z(t) = D_z k_z(t),$$

where: $D_x$, $D_y$, $D_z$=distances of the respective calibration slices from system isocenter; and $k_x$, $k_y$, $k_z$=location in k-space of excited spins along respective k-space axes.

In the preferred embodiment calibration data is acquired twenty times for each gradient axis and the results averaged. This step requires 500 to 1,000 ms of acquisition time.

Referring again to FIG. 9, two data sets are then acquired as indicated at process block 390 using one of the 3-D projection reconstruction pulse sequences described above and shown in FIG. 5 or 7. In both preferred embodiments described above the pulse sequences are repeated to sample radial trajectories along many different trajectories until the entire 3D k-space volume is sampled to the prescribed density. This is accomplished by modulating the relative amplitudes of the respective readout gradient waveforms $G_x$, $G_y$ and $G_z$. The angular spacing is chosen such that a uniform distribution of k-space sample points occurs at the peripheral boundary ($k_{max}$) of the sampled k-space sphere. The acquisition is done on a 1.5 T scanner with a 40 mT/m maximum peak gradient amplitude and a 150 mT/m/s maximum slew rate. A receiver bandwidth of ±125 kMz was used to achieve the shortest TR possible. A readout resolution equivalent to 128 radial k-space sample points was used for each radial trajectory, giving an equivalent image matrix size of 256× 256×256 over a 24 cm spherical FOV with 0.94 mm isotropic resolution. The center frequency for the exam is set halfway between the fat and water resonance peaks.

As indicated at process block 394, the next step is to correct the k-space data sets for sampling position errors using the three sets of calibration phase data $\Delta\phi_x(t)$, $\Delta\phi_y(t)$, $\Delta\phi_z(t)$. First, the actual k-space location from which NMR signals are sampled during a projection acquisition along each of the gradient axes x, y and z is calculated:

$$k_x(t)=\Delta\phi_x(t)/D_x$$

$$k_y(t)=\Delta\phi_y(t)/D_y$$

$$k_z(t)=\Delta\phi_z(t)/D_z.$$

These corrected k-space sampling points for each gradient axis are then combined to provide the actual sampling points $k_{actual}(t)$ for each acquired sampling trajectory by calculating the following dot product:

$$k_{actual}(t) = [k_{x\,max} \quad k_{y\,max} \quad k_{z\,max}] \cdot \begin{bmatrix} k_x(t) \\ k_y(t) \\ k_z(t) \end{bmatrix}$$

where: $k_{xmax}$, $k_{ymax}$, $k_{zmax}$ =are the endpoints of the acquired sampling trajectory on a unit circle. For example, if the acquired sampling trajectory is directed along the x-axis only, $k_{xmax}$ is "1" and the $k_{ymax}$ and $k_{zmax}$ values are zero. In this case the actual sampling points $k_{actual}(t)=k_x(t)$. Of course, nearly all the acquired sampling trajectories are directed along 2 or 3 gradient axes and the actual sampling points $k_{actual}(t)$ are a combination of the three corrected k-space sampling points $k_x(t)$, $k_y(t)$ and $k_z(t)$.

This correction of the acquired k-space data set is performed on each trajectory to produce acquired and corrected k-space data sets. It should be apparent, however, that this correction does not actually alter the sampled NMR signals, but instead, correctly identifies the locations in k-space from which the samples were actually obtained. The actual implementation of these corrections occurs in the regridding process which follows.

As indicated by process blocks 393 and 395, the next step is to change the phase of each complex k-space sample in the data set formed by the second echo signals by +90° and −90° (or +270°) respectively. These two phase shifted second echo data sets are then combined with two copies of the first echo data set to form two complete k-space data sets. These phase shifted values are combined to suppress water or fat only at k-space sample points throughout the center region of k-space. The k-space data set which is fat suppressed is therefore comprised of:

peripheral echo 1 and peripheral echo 2 samples and
central echo 1+central (+90°) phase shifted echo 2 samples.

The k-space data set which is water suppressed is comprised of:

peripheral echo 1 and peripheral echo 2 samples and
central echo 1+central (−90°) phase shifted echo 2 samples, where "peripheral" denotes data close to k-space outer edge and "central" denotes data near the center of k-space.

In the preferred method this combination of the k-space data sets occurs during the performance of a regridding step indicated at process block 396 to place each of these complete k-space data sets on a 3D Cartesian grid. This is done so that a 3DFT image reconstruction can be performed. Such regridding methods are well known in the art and is described, for example, in J. Jackson et al, "Selection Of Convolution Function For Fourier Inversion Using Gridding," IEEE Trans. Med. Imaging, 10, 473–478, 1991. This regridding step is performed with the actual sampling trajectories $k_{actual}(t)$ rather than the theoretical radial sampling trajectories. The interpolation process that characterizes the regridding of radial sample points to Cartesian sampling points thus employs the actual sample points $k_{actual}(t)$ for each trajectory. The resulting 3D array of k-space data are density compensated with a $\rho^2$ filter, where $\rho$ is the k-space radius of the acquired data point being interpolated onto the Cartesian grid. The $\rho=0$ point is weighted according to the finite sphere of volume that it samples, similar to the correction proposed for 2D projection filters. The kernel used for the regridding process is either a simple triangle function, which is computationally very fast, or a Kaiser-Bessel function, which has the advantage of reducing aliased energy from the regridding process.

The combination of the k-space data sets that takes place during the regridding step is illustrated in FIG. 12 where the x's are the Cartesian grid points. For any given number of acquired projections, there will be a circular central region of k-space indicated by dashed lines 374 for which the angular distance between acquired k-space samples will be equal or less than one-half the spacing between grid points ($\leq 0.5$/FOV). Within this central region, data at the same k-space radius and from adjacent projections are interpolated to primarily the same Cartesian grid point. For example, a k-space sample 375 in a first readout k-space trajectory 366 is combined with a k-space sample 376 to form a Cartesian grid point value 377. This combination through regridding interpolation results in fat and water separation for spatial frequencies within this central region 374. As one moves radially outward from the central region 374 the angular spacing between acquired k-space samples grows relative to the fixed Cartesian grid point spacing, and at these spatial frequencies the fat and water separation does not occur because the regridding operation will interpolate the acquired k-space data to more than one Cartesian grid point. Since the vast majority of the signal from fat or water originates from the low special frequencies near the center of k-space good suppression is achieved even though the desired k-space data combination does not occur at the periphery of k-space.

The size of the central region 374 of k-space in which water and fat suppression occurs during the regridding step 396 is determined by the Cartesian grid sample spacing and the number of acquired projections. In the preferred embodiment the Cartesian grid sample spacing is set equal to the radial sampling interval of the acquired projections which is 1/FOV. The regridding operation is an interpolation process where the acquired projection k-space data is interpolated to estimate the k-space data at each sample location on the Cartesian grid. It can also be viewed as a convolution operation where the acquired projection k-space data is convolved with a function and the output is calculated at each sample point on the Cartesian grid. The convolution function is set so that only acquired k-space projection samples within approximately 1/FOV of a Cartesian sample location contribute to that output. It can be appreciated that near the center of k-space where the spacing of acquired k-space projection samples are less than 1/FOV apart, k-space samples from two adjacent projections (i.e., one with phase shift and the other without phase shift) will be combined together at some Cartesian sample locations. The higher the number of projections that are acquired the further out from the center of k-space this condition exists, and hence the further out the fat/water suppression combination occurs.

As indicated at process block 398 the two regridded k-space data sets are then Fourier-transformed in all three directions to reconstruct a water image 399 and a fat image 400 respectively. In the preferred embodiments each sampled radial trajectory extends from the center to the periphery of the k-space volume in only one direction but samples reflected about the k-space origin are not acquired. The missing data is synthesized with a 3D homodyne process such as that described by Noll and Nishimura, "Homodyne Detection In Magnetic Resonance Imaging," IEEE Transactions on Medical Imaging, Vol. 10, No. 2, June 1991 and in U.S. Pat. No. 5,243,284.

While both a water image and a fat image may be produced, in most clinical applications the water image is used. More specifically, the three-dimensional water image may be examined by taking two-dimensional slices through the three-dimensional image to examine specific anatomy. Or, the 3-D image may be projected on to a two-dimensional image plane at a selected projection angle using any of the well known projection techniques.

Figure 11A:
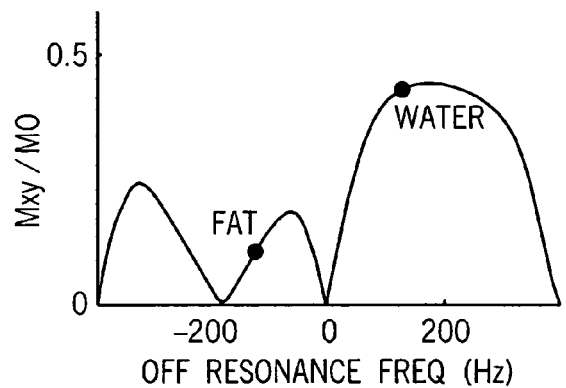
FIGS. 11A–11C are graphic presentations of the discrimination between fat and water signal.
Figure 11B:
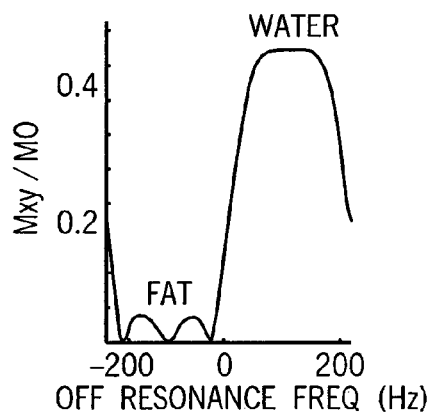
Figure 11C:
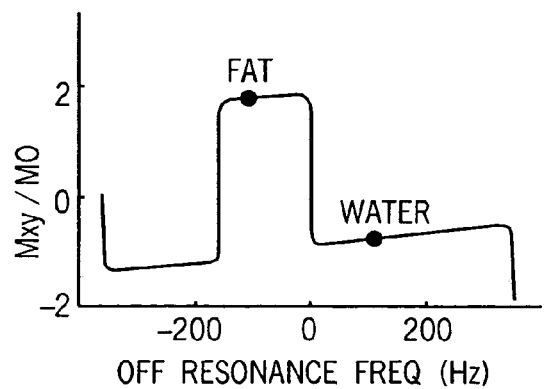

By linearly combining the two echoes as described above, either fat (echo1+i*echo2) or water (echo1−i*echo2) suppression can be achieved as shown in FIG. 11A. The unwanted species is not suppressed as well as in LC-SSFP shown in FIG. 11B, but the desired passband is much wider as shown in FIG. 11A. However, since the phases of the suppressed band can be clearly discriminated as shown in FIG. 11C a threshold technique can be applied to display only those pixels whose phases fall outside the suppressed band.

Referring again to FIG. 9, if further suppression of fat or water is needed in the images 339 or 400 as determined at decision block 402, the phase ($\phi=\tan^{-1}Q/I$) of each complex image pixel is examined at process block 404. Those pixels having a phase outside the range expected of water (in the water image 399) or fat (in the fat image 400) are filtered out by setting their magnitudes to zero. As a result, a more refined water image 406 and fat image 408 are produced.

The invention claimed is:

1. A method for producing an image with an MRI system, the steps comprising:
    a) performing a projection reconstruction pulse sequence with the MRI system which produces an rf excitation pulse at a frequency between the resonant frequencies of fat and water to acquire a first NMR signal that samples a first radial trajectory in k-space and to acquire a second NMR signal that samples a second radial trajectory in k-space;
    b) repeating step a) a plurality of times to sample a corresponding plurality of different radial trajectories in k-space;
    c) forming a first k-space data set with the acquired first NMR signals;
    d) forming a second k-space data set with the acquired second NMR signals;
    e) rotating the phase of k-space samples in one of said k-space data sets to form a phase shifted k-space data set;
    f) combining the phase shifted k-space data set with the other k-space data set to form a combined k-space data set; and
    g) reconstructing an image from the combined k-space data set.

2. The method as recited in claim 1 in which step f) includes adding the phase rotated k-space samples in the phase shifted k-space data set to corresponding k-space samples in the other k-space data set.

3. The method as recited in claim 1 in which step f) includes:
    i) regridding the phase shifted k-space data set to place each signal sample therein on a Cartesian grid;
    ii) regridding the other k-space data set to place each signal sample therein on the Cartesian grid; and
    iii) combining the two regridded k-space data sets.

4. The method as recited in claim 3 in which the phase of k-space samples is rotated substantially ±90°.

5. The method as recited in claim 1 in which the phase of k-space samples is rotated substantially ±90°.

6. The method as recited in claim 1 which includes:
    h) detecting the phase of each pixel in the reconstructed image; and
    i) filtering out pixels that do not have a phase in a selected passband.

7. A method for producing an image with an MRI system, the steps comprising:
    a) performing a projection reconstruction pulse sequence with the MRI system to acquire a first NMR signal that samples a first radial trajectory in k-space and to acquire a second NMR signal that samples a second radial trajectory in k-space adjacent to the first radial trajectory;
    b) repeating step a) a plurality of times to sample a corresponding plurality of different radial trajectories extending outward from the center of k-space and forming therefrom first and second k-space data sets in which the acquired radial trajectories are interleaved;
    c) rotating the phase of k-space samples in one of said first or second k-space data sets;
    d) regridding the phase shifted k-space data set and the other of said first or second k-space data sets to the same Cartesian grid; and
    e) reconstructing an image from the regridded k-space data.

8. The method as recited in claim 7 in which the first and second k-space data sets are three-dimensional data sets and the reconstructed image is a three-dimensional image.

9. The method as recited in claim 7 in which the phase of k-space samples is rotated in step c) by substantially 90°.

10. The method as recited in claim 7 in which the first and second NMR signals are sampled at intervals 1/FOV in k-space, and the Cartesian grid includes sample points at intervals 1/FOV in k-space.

11. The method as recited in claim 7 which step a) includes producing an rf excitation pulse in said pulse sequence that is tuned between the resonant frequencies of fat and water.

12. The method as recited in claim 7 in which the pulse sequence is an SSFP pulse sequence.

* * * * *

UNITED STATES PATENT AND TRADEMARK OFFICE
CERTIFICATE OF CORRECTION

PATENT NO. : 7,148,685 B2 Page 1 of 1
APPLICATION NO. : 10/940738
DATED : December 12, 2006
INVENTOR(S) : Block et al.

It is certified that error appears in the above-identified patent and that said Letters Patent is hereby corrected as shown below:

Column 2, line 43, Read, "set c combined" should be, -- set can be combined --.

Column 12, Claim 11, line 58, Reads, "7 which" should read, -- 7 in which --.

Signed and Sealed this

Sixth Day of March, 2007

JON W. DUDAS
*Director of the United States Patent and Trademark Office*